United States Patent [19]

Yamada et al.

[11] Patent Number: 4,550,612
[45] Date of Patent: Nov. 5, 1985

[54] INTEGRATED PRESSURE SENSOR

[75] Inventors: Kazuji Yamada; Shigeyuki Kobori; Satoshi Shimada; Ryosaku Kanzawa, all of Hitachi; Ryoichi Kobayashi, Ibaraki; Hideo Sato, Hitachi, all of Japan

[73] Assignee: Hitachi, Ltd., Tokyo, Japan

[21] Appl. No.: 615,524

[22] Filed: May 31, 1984

[30] Foreign Application Priority Data

May 31, 1983 [JP] Japan ................................. 58-97477

[51] Int. Cl.$^4$ .............................................. G01L 9/06
[52] U.S. Cl. .......................................... 73/727; 338/4

[58] Field of Search ................... 73/727, 721, DIG. 4; 338/4, 42; 310/338

[56] References Cited

U.S. PATENT DOCUMENTS 4,121,334 10/1978 Wallis ..................................... 338/4

Primary Examiner—Donald O. Woodiel
Attorney, Agent, or Firm—Antonelli, Terry & Wands

[57] ABSTRACT

In an integrated pressure sensor, a silicon chip for pressure detection and a substrate for supporting the silicon chip are made of the same material, the silicon chip has a thin diaphragm portion and a peripheral fixed portion thicker than the diaphragm portion, and the silicon chip is bonded to the substrate through a thin insulating film.

7 Claims, 6 Drawing Figures

INTEGRATED PRESSURE SENSOR

The present invention relates to a semiconductor pressure sensor, and more particularly to the sensor structure suitable for use in a pressure sensor provided with an integrated signal processing circuit.

A pressure sensor has been known in which a silicon chip for pressure detection is fixed to a silicon substrate through a thin, borosilicate glass film (refer to J. Electrochem. Soc. Vol. 119, No. 4, 1972, pages 545 and 546).

FIG. 4 shows the structure of the conventional sensor. A silicon chip 1 for detecting pressure is electrostatically bonded to a silicon substrate 2 through a borosilicate glass film 4 to form a room 5 between the substrate and the chip. Gauge resistors 3 are formed in the surface of the silicon chip 1.

In such a structure, however, a fixed portion of the chip 1 (namely, a portion bonded to the substrate 2) is equal in thickness to a central diaphragm portion 6 of the chip. Accordingly, owing to variations in thickness of the glass film and the roughness of the substrate surface, a large stress is generated in that surface 7a, 7b of the chip 1 which is apart from the substrate 2. Thus, when active elements are arranged in the above surface 7a, 7b, the characteristics of the active elements are greatly affected by the stress. Further, since the diaphragm portion 6 of the chip 1 cannot be discriminated from the bonded portion thereof, it is difficult to dispose the chip 1 on the substrate 2 with a desired positional relation.

It is accordingly an object of the present invention to provide an integrated pressure sensor which has a structure capable of producing uniform characteristics.

In order to attain the above object, the present inventors have first confirmed, by experiments, that the characteristics of an operational amplifier which includes an npn input transistor and has two-stage amplifying structure to obtain an amplification factor of 100 dB, are not changed after electrostatically bonding the rear side of the operational amplifier silicon to, for example instead of silicon, borosilicate glass in air. Further, in a pressure sensor according to the present invention, the substrate is made of silicon in order to make the coefficient of linear expansion of the substrate to the silicon chip, and the silicon chip is bonded to the substrate through a thin insulating film. That is, the coefficient of linear expansion of the chip is made exactly equal to that of the substrate. Furthermore, the fixed portion (namely, bonded portion) of the silicon chip is made very thick in order not to be affected by a stress which is caused, after the electrostatic bonding, by variations in thickness of the thin insulating film and the non-uniform polishing at the substrate surface and the rear surface of the chip.

The present invention will be apparent from the following detailed description taken in conjunction with the accompanying drawings, in which.

Figure 1:
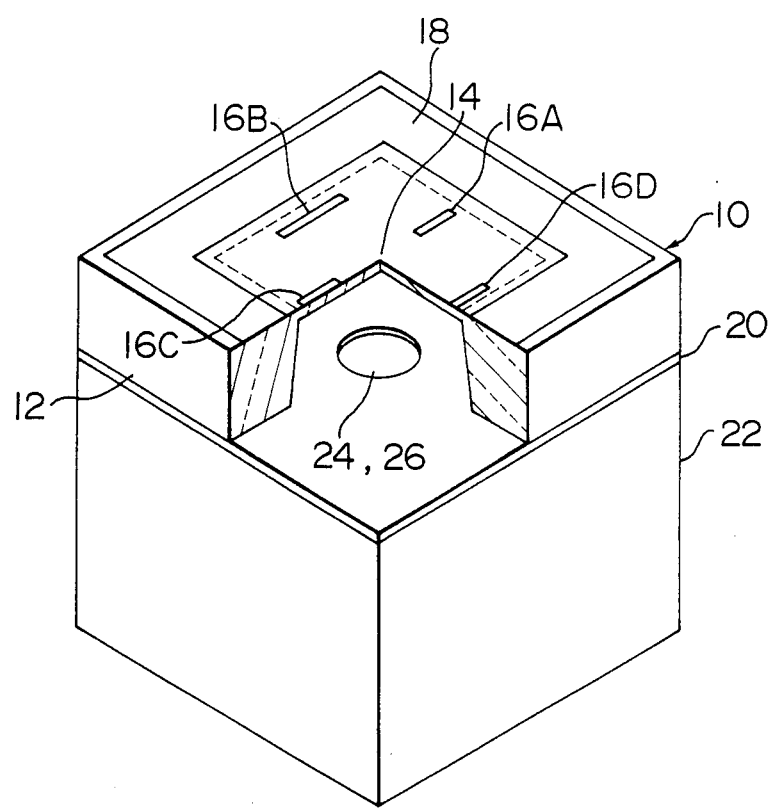
FIG. 1 is a perspective view, partly crosssectional, of an embodiment of an integrated pressure sensor according to the present invention.

Referring to FIG. 1 which shows an embodiment of an integrated pressure sensor according to the present invention, a silicon chip 10 has a peripheral fixed portion 12 which is large in thickness, and a central diaphragm portion 14 which is made thin by etching. Four gauge resistors 16A to 16D are formed in the diaphragm portion 14, and an integrated signal processing circuit 18 is formed in the peripheral portion 12. Signals produced by the gauge resistors 16A to 16D are processed by the signal processing circuit 18.

The silicon chip 10 is bonded to a substrate 22 through a thin borosilicate glass film 20 which is approximately equal in coefficient of linear expansion to the silicon chip 10. The substrate 22 is made of the same silicon as the silicon chip 10. Gas flow paths 24 and 26 are provided in central portions of the thin film 20 and substrate 22, respectively.

In the case where a space formed between the silicon chip 10 and substrate 22 is to be made vacuum or kept at a constant pressure, the gas flow paths 24 and 26 are not provided in the thin film 20 and substrate 22.

Figure 2A:
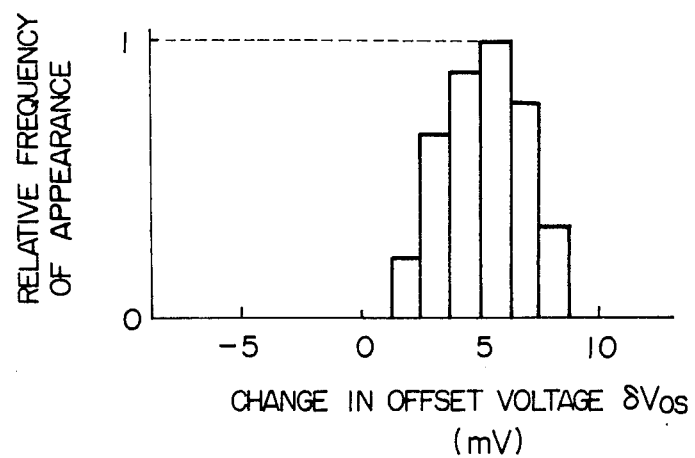
FIGS. 2a and 2b are graphs showing changes in offset voltage in pressure sensor according to the present invention.
Figure 2B:
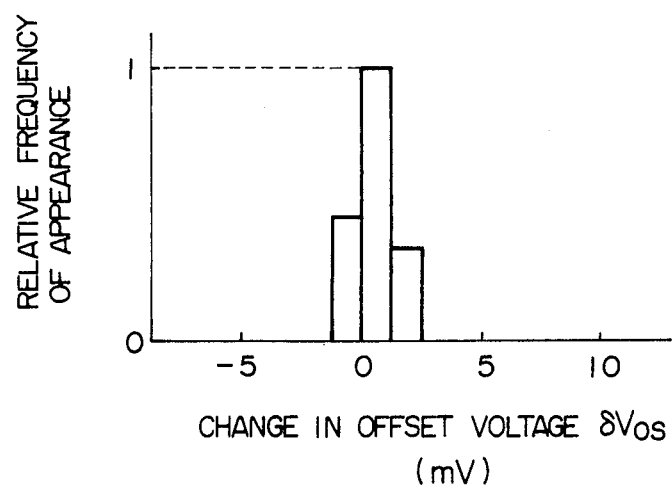

FIGS. 2a and 2b are graphs showing the experimental results with respect to changes in offset voltage output caused by bonding the silicon chip 10 to a substrate of the structure shown in FIG. 1. FIG. 2a shows the case where the substrate is made of borosilicate glass, and FIG. 2b shows the case where the substrate is made of silicon. As is apparent from FIG. 2a, if borosilicate glass is used for the substrate, the offset voltage is changed by the bonding operation. The reasons for this are as follows. The signal processing circuit 18 is not provided in the diaphragm portion 14 but provided in the peripheral portion 12, in order that the characteristics of the circuit 18 are not affected by the distortion (or deformation) of the diaphragm portion 14. However, when the signal processing circuit 18 is provided in the pheripheral portion 12, it is difficult to dispose a pair of resistors or transistors in close proximity to each other and in the same direction so that the effect of the stress caused by the bonding operation on one of the resistors or transistors and the effect of the stress on the other resistor or transistor cancel each other. Accordingly, in the case where the silicon chip is bonded to the borosilicate glass substrate, the influence of the stress caused by the bonding operation varies with circuit elements, and thus the offset voltage is changed by the bonding operation as shown in FIG. 2a. It is desirable that both of the chip 10 and substrate 22 are made of silicon. When the silicon chip is bonded to the silicon substrate, no thermal stress is generated by the heat treatment for the bonding operation. That is, the offset voltage is not changed by the bonding operation. As mentioned above, the characteristics of a resistor or transistor included in the signal processing circuit 18 are affected by the stress due to the bonding operation. In order for the stress to produce no effect on the characteristics of the signal processing circuit, it is required to dispose a pair of similar resistors or transistors in close proximity to each other and in the same direction. Such circuit elements cannot be provided in the diaphragm portion 14, since the diaphragm portion is subjected to a large distortion (or deformation). That is, the circuit elements must be disposed in the pheripheral portion 12. However, the pheripheral portion has the form of a ring, and therefore the layout of the circuit elements is greatly restricted. Thus, it is difficult to provide the circuit elements in the pheripheral portion in a desired arrangement. In the structure according to the present invention, no stress is generated by the bonding operation, and therefore such strict layout of the circuit elements is not required.

Figure 4:
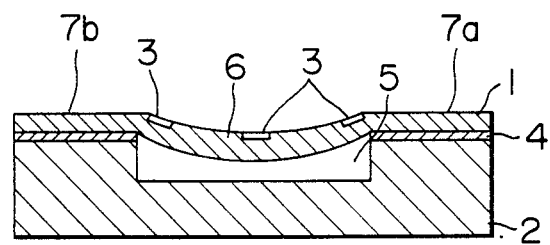
FIG. 4 is a sectional view of the conventional pressure sensor.

Further, in the case where the silicon chip is designed so as to have the form of a thin, flat plate as shown in FIG. 4, different local stresses are caused, in the surface of the fixed portion (namely, the bonded portion) of the silicon chip, by variations in thickness of the thin, borosilicate glass film, the roughness of substrate surface, and the roughness of the rear surface of the silicon chip. Thus, the characteristics of the signal processing circuit are greatly changed by the bonding operation.

The thickness of the diaphragm portion is usually made less than 100 μm. In the case where a large-diameter silicon wafer used in an IC process has a thickness less than 200 μm, the wafer is readily cracked or broken by the handling prior to the IC process. Accordingly, it is required to use a silicon wafer having a thickness more than 200 μm. Then, it is preferable to make thin only the diaphragm portion of the silicon wafer (namely, silicon chip) as in the present invention, since the area of the thinned portion is smaller as compared with the case where the whole of the silicon wafer is thinned.

Figure 3A:
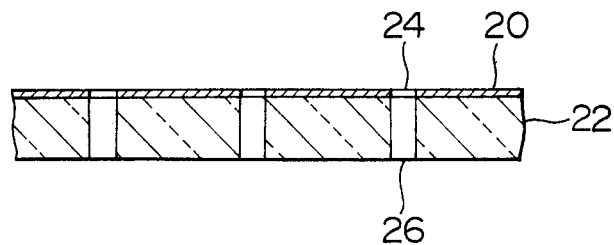
FIGS. 3a and 3b are sectional views for explaining a method of fabricating an integrated pressure sensor according to the present invention.
Figure 3B:
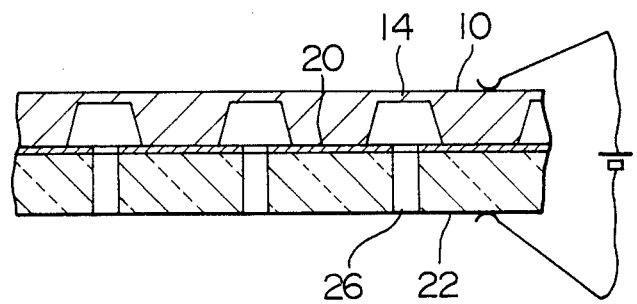

A method of fabricating a pressure sensor according to the present invention will be explained below, with reference to FIGS. 3a and 3b. In FIG. 3a, reference numeral 22 designates a silicon substrate, 20 a thin, borosilicate glass film, and 24 and 26 gas flow paths. The borosilicate glass film 20 can be formed on the substrate 22 by various methods, but is usually formed by the sputtering method. FIG. 3b shows a method of electrostatically bonding a silicon wafer (namely, a silicon chip 10) including an integrated signal processing circuit in the surface thereof, to the silicon substrate 22. Referring to FIG. 3b, a voltage is applied between the silicon chip 10 and silicon substrate 22 at an appropriate ambient temperature (for example, 400° C.), to bond the silicon chip and silicon substrate together. In this case, the silicon chip is positively biased with respect to the silicon substrate. Electrodes for applying the above voltage may be disposed on the silicon chip and silicon substrate in a desired manner, as long as the silicon chip can be at a positive potential with respect to the silicon substrate. Further, the borosilicate glass film previously formed on the chip side may be electrostatically bonded to the silicon substrate.

In the case where a space formed beneath the diaphragm portion is required to be hermetically sealed, the gas flow path 26 is not provided in the borosilicate glass film 20 and the silicon substrate 22.

In the foregoing explanation, a thin borosilicate glass film has been interposed between the silicon chip and silicon substrate. However, the material for forming such a thin film is not limited to borosilicate glass, but the thin film may be made of any material which can be electrostatically bonded to silicon. Even if this material has a large coefficient of linear expansion, the silicon chip will not be affected by the thermal stress due to a difference in coefficient of linear expansion between the material and silicon, since the greater part of such a stress is concentrated to the thin film having a thickness as small as 4 μm. Moreover, the bonded portion of the silicon chip is large in thickness and rigidity, and therefore the stress at the thin film is scarcely transmitted to the surface of the silicon chip.

It is to be noted that the thickness of the thin film is made small so that the surface of the silicon chip is scarcely affected by the stress which is generated in the thin film by the electrostatic bonding.

As has been explained in the foregoing, according to the present invention, there is provided a pressure sensor, the characteristics of which are scarcely affected by a process for bonding a pressure sensitive chip to a substrate.

We claim:

1. An integrated pressure sensor comprising:
   a silicon chip having a thin diaphragm portion and a peripheral fixed portion, gauge resistors being formed on said diaphragm portion, said fixed portion being thicker than said diaphragm portion;
   a substrate made of the same material as said silicon chip for supporting said silicon chip;
   a thin insulating film interposed between said silicon chip and said substrate; and
   a signal processing circuit formed in the surface of said fixed portion.

2. An integrated pressure sensor according to claim 1, wherein electrostatic bonding is applicable to said thin insulating film.

3. An integrated pressure sensor according to claim 2, wherein said thin insulating film is formed on said substrate, and is electrostatically bonded to said silicon chip.

4. An integrated pressure sensor according to claim 2, wherein said thin insulating film is formed on said fixed portion of said silicon chip, and is electrostatically bonded to said substrate.

5. An integrated pressure sensor according to claim 2, wherein said thin insulating film is made of borosilicate glass.

6. An integrated pressure sensor according to claim 1, wherein said thin insulating film is formed by a sputtering method.

7. An integrated pressure sensor according to claim 1, wherein a gas flow path is formed in each of said substrate and said thin insulating film.

* * * * *